(12) United States Patent
Zhu et al.

(10) Patent No.: US 8,974,602 B2
(45) Date of Patent: Mar. 10, 2015

(54) METHOD OF REDUCING CONTAMINATION IN CVD CHAMBER

(71) Applicant: Shanghai Huali Microelectronics Corporation, Shanghai (CN)

(72) Inventors: Yadan Zhu, Shanghai (CN); Jun Zhou, Shanghai (CN)

(73) Assignee: Shanghia Huali Microelectronics Corporation, Shanghai (CN)

( * ) Notice: Subject to any disclaimer, the term of this patent is extended or adjusted under 35 U.S.C. 154(b) by 58 days.

(21) Appl. No.: 14/040,739

(22) Filed: Sep. 30, 2013

(65) Prior Publication Data

US 2015/0000694 A1    Jan. 1, 2015

(30) Foreign Application Priority Data

May 31, 2013  (CN) .......................... 2013 1 0213637

(51) Int. Cl.
| | |
|---|---|
| C25F 1/00 | (2006.01) |
| C23C 16/44 | (2006.01) |
| B08B 5/00 | (2006.01) |
| B08B 7/00 | (2006.01) |
| B08B 9/00 | (2006.01) |
| B08B 9/027 | (2006.01) |

(52) U.S. Cl.
CPC ......... *C23C 16/4405* (2013.01); *C23C 16/4404* (2013.01); *C23C 16/4408* (2013.01); *B08B 5/00* (2013.01); *B08B 7/0035* (2013.01); *B08B 9/00* (2013.01); *B08B 9/027* (2013.01); *Y10S 134/902* (2013.01)
USPC ...... 134/1.1; 134/1; 134/2; 134/21; 134/22.1; 134/26; 134/30; 134/42; 134/902

(58) Field of Classification Search
CPC ............ C23C 16/4404; C23C 16/4408; C23C 16/4405; B08B 5/00; B08B 7/0035; B08B 9/00; B08B 9/027
USPC .......... 134/1, 1.1, 2, 21, 22.1, 26, 30, 42, 902
See application file for complete search history.

(56) References Cited

U.S. PATENT DOCUMENTS

| | | | |
|---|---|---|---|
| 7,624,742 B1 * | 12/2009 | Zuck .............................. | 134/1.3 |
| 2007/0246062 A1 * | 10/2007 | Lai et al. ...................... | 134/1.1 |
| 2015/0000694 A1 * | 1/2015 | Zhu et al. ..................... | 134/1.1 |

* cited by examiner

*Primary Examiner* — Bibi Carrillo

(57) ABSTRACT

The present invention discloses a method of reducing contamination in a CVD chamber. The method comprises cleaning the CVD chamber with first cleaning gases containing $NF_3$; removing the particles in the CVD chamber with second cleaning gases containing $N_2$; further removing the particles in the CVD chamber with third cleaning gases containing $O_2$; and seasoning an amorphous carbon layer with mixed gases containing $C_2H_2$ and an inert gas.

15 Claims, 1 Drawing Sheet

US 8,974,602 B2

METHOD OF REDUCING CONTAMINATION IN CVD CHAMBER

CROSS-REFERENCE TO RELATED APPLICATION

This application claims the priority benefit of China application serial no. 201310213637.4, filed May 31, 2013. All disclosure of the China application is incorporated herein by reference.

FIELD OF THE INVENTION

The present invention relates to the field of semiconductor fabrication. More particularly, it relates to a method of reducing the contamination in a Chemical Vapor Deposition (CVD) chamber.

BACKGROUND OF THE INVENTION

The metal oxide semiconductor field effect transistors (MOSFETs) are the main devices used in the integrated circuits, and especially in the very large scale integrated circuits. As the MOSFETs are scaled down, Aluminum interconnection has been replaced by copper interconnection during the MOSFETs manufacturing processes, and the MOSFET gate material has been developed from tungsten compound, titanium compound and cobalt compound to nickel compound, and even to metal ($Al_2O_3$, $Ta_2O_5$, etc.). In addition, by the new technology, the advent of the application of ruthenium as the electroplating seed layer and manganese as the copper barrier layer has diversify the types of the metals that can be used during the fabrication of the MOSFETs, which provides more choice in the MOSFETs device manufacturing.

However, if these metals are attached to the backside of a wafer during the processes, the subsequent processing devices may be contaminated, and then another wafer entering into the subsequent processing devices may also be contaminated, thereby causing the cross contamination between the silicon wafers and the processing devices. And more especially, since some manufacturing processes are required to be performed under a fairly high temperature (even higher than 1000° C.), these metals may even diffuse into the internal of the wafer, thereby leading to a failure of the entire device. Consequently, it is very important and indispensable to control the metal contamination at the backside of a wafer during every manufacturing process step of a MOSFET device, as well as to reduce the contaminant levels in the processing devices.

Chemical vapor deposition (CVD) is one of main process in the MOSFET device fabrication. It is well-known that before the CVD process for forming a thin film on the wafer, the CVD chamber should be cleaned to remove the accumulated coatings on the interior chamber surfaces and the wafer heater, as well as to remove the suspended particles in the chamber, so as to reduce the contaminant levels in the CVD chamber. In the cleaning process, a cleaning gas comprising $NF_3$ is introduced in the chamber, and excited into fluorine plasma through ionization, the fluoride plasma reacts with the coatings on the surfaces of the interior chamber and the wafer heater to generate a fluorine-containing gas, which is exhausted by a pump afterwards, thus to achieve the purpose of cleaning the chamber. Once the chamber has been sufficiently cleaned by the cleaning gas and the cleaning by-products have been exhausted out of the chamber, a season step is performed to seal the remaining contaminants in the processing region of the chamber and further reduce the contamination level, thus to make the atmosphere in the chamber more suitable for the CVD process. This season step is typically carried out by depositing a season film to coat the surfaces of the interior chamber and the heater. When depositing an amorphous carbon film (APF) using the processing device commercially available from Applied Materials, Inc., the applicant finds that the content of metal aluminum at the backside of the wafer seriously exceeding the industry standard (aluminum<1 $e^{11}$ atom/$cm^2$, other metals<5 $e^{10}$ atom/$cm^2$) by total reflection X-ray fluorescence (TXRF). Through experiments, it is found that in the CVD chamber provided by the Applied Materials, a very thin layer of $Al_xF_yO_z$ is formed on the surface of the heater through the reaction between the fluoride ions generated from the cleaning gas $NF_3$ and the AlN material of the heater, and then the $Al_xF_yO_z$ further reacts with the $N_2$ gas, which is introduced in the chamber after the cleaning process with $C_2H_2$ gas for APF film deposition, to generate the AlN, thereby making the surface of the APF film containing AlN and causing Aluminum contamination more than 1 $e^{11}$ atom/$cm^2$ at the backside of the wafer when contacting with the APF film.

Therefore, there exists a need for a method for further reducing metal contaminants at the backside of a wafer within a CVD chamber.

SUMMARY OF THE INVENTION

In order to solve the problems of existing technology, the present invention provides a method of reducing contamination in CVD chambers.

To achieve these and other advantages and in accordance with the objective of the invention, as embodied and broadly described herein, the invention provides a method of reducing contamination in CVD chambers, the CVD chamber comprises a wafer heater made of AlN, the method comprises the steps of:

Step S01, cleaning the CVD chamber with first cleaning gases containing $NF_3$; wherein the $NF_3$ gas is excited into fluorine plasma through ionization, the fluoride plasma reacts with the coatings on the surfaces of the interior chamber and the heater to generate a fluorine-containing gas, which is exhausted by a pump afterwards, to clean the CVD chamber; the fluoride plasma also reacts with the AlN material of the wafer heater to form a thin $Al_xF_yO_z$ film on the surface of the heater; and Step S02, removing the particles in the CVD chamber with second cleaning gases containing $N_2$; some of the $N_2$ gas reacts with the thin $Al_xF_yO_z$ film to generate the particles of AlN;

Step S03, further removing the particles in the CVD chamber with third cleaning gases containing $O_2$; and Step S04, seasoning an amorphous carbon film on the surfaces of the interior chamber and the heater with mixed gases containing $C_2H_2$ and at least one inert gas; the amorphous carbon layer converts the thin $Al_xF_yO_z$ film as well as the particles of AlN.

Preferably, the first cleaning gases contain $NF_3$, $O_2$ and an inert gas in the step S01, and plasma of the cleaning gases are excited by a remote plasma source (RPS) to clean the CVD chamber.

Preferably, the power of the remote plasma source is 4000-7000 W; the flow rate of the $NF_3$ gas is 200-700 sccm, the flow rate of the $O_2$ gas is 6000-9000 sccm and the flow rate of the inert gas is 2000-8000 sccm in the step S01.

Preferably, the second cleaning gases contain $N_2$ and an inert gas in the step S02, and $N_2$ plasma is generated by a high frequency plasma source to remove the particles in the CVD chamber.

Preferably, the power of the high frequency plasma source is 500-1600 W, the flow rate of the $N_2$ gas and the inert gas are both 1000-5000 sccm and the process time of the second cleaning gases is 0-100 s in the step S02.

Preferably, the third cleaning gases contain $O_2$ and an inert gas in the step S03, and $O_2$ plasma is generated by a high frequency plasma source to further remove the particles in the CVD chamber.

Preferably, the power of the high frequency plasma source is 800-1200 W, the flow rate of the $O_2$ gas and inert gas are both 3000-5000 sccm and the process time of the third cleaning gas is 10-100 s in the step S03.

Preferably, the mixed gases are ionized by a high plasma source to form the amorphous carbon film in the step S04.

Preferably, the power of the high frequency plasma source is 800-1200 W and the flow rate of the $C_2H_2$ gas and the inert gas are both 300-10000 sccm in the step S04.

Preferably, at least one of the first cleaning gases, the second cleaning gases and the third cleaning gases comprises an inert gas, the inert gas of the cleaning gases and the inert gas of the mixed gases are selected from at least one of He, Ne, Ar, Kr, Xe, or Rn.

Preferably, the inert gas in the step S01 is Ar, the inert gas in the step S02 and S03 is He, and the at least one inert gas in the step S04 is a mixture of He and Ar.

Preferably, the cleaning gases are introduced into the CVD chamber through a gas faceplate, the distance between the heater and the gas faceplate is 1-1000 mm.

The present invention provides a method of reducing contamination in the CVD chamber by seasoning an amorphous carbon film on the surfaces of the interior chamber and the heater which covers the $Al_xF_yO_z$ film and the particles of AlN so as to seal the metal contaminants on the heater surface. Furthermore, since the mixed gases for seasoning the amorphous carbon film do not react with the $Al_xF_yO_z$ film or the particles of AlN, new metal contaminants will not be generated on the surface of the amorphous carbon film, which solves the problem of the excessive metal contamination due to the AlN metal particles attached to the backside of a silicon the wafer on the heater. In addition, the suspended tiny particles will be attached to the surfaces of the interior chamber by the second cleaning gas (containing $N_2$) or flowed away by the third cleaning gas (containing $O_2$), thus the suspended particles which may be attached on the wafer surface during the subsequent CVD process can also be reduced.

BRIEF DESCRIPTION OF THE DRAWINGS

In order to provide a further understanding of the purposes, features and advantages of the invention, preferred embodiments of the invention are described in detail with reference to the following accompanying drawings, in which.

DETAILED DESCRIPTION OF THE EMBODIMENTS

Figure 1:
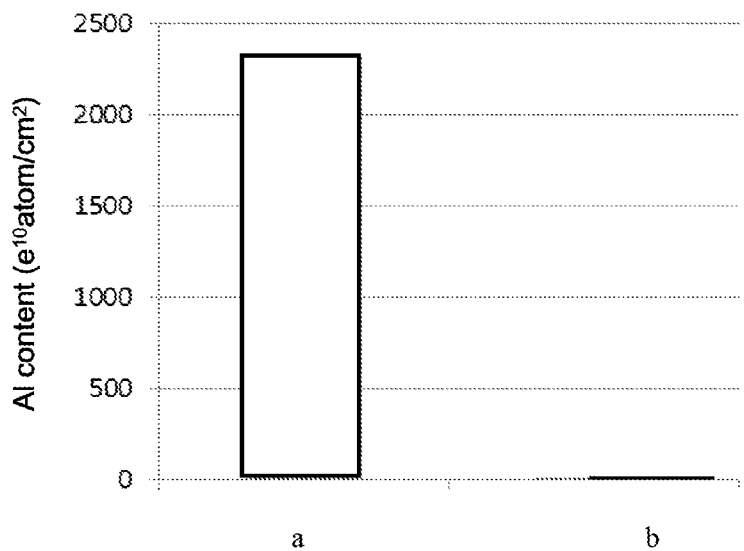
FIG. 1 is a contrast diagram showing the Al content attached to the backside of a wafer after seasoning between the existing technology and the method in accordance with the present invention.

Reference will now be made in detail to the present preferred embodiments and the accompanying drawings of the invention in order to provide a further understanding of the invention.

In this embodiment, the method of reducing the contamination in a CVD chamber is provided. The CVD chamber comprises a wafer heater and a gas faceplate, wherein the material of the wafer heater is AlN. The method comprises the steps as follows:

Step S01, first cleaning gases containing $NF_3$ are introduced into the CVD chamber to clean the CVD chamber. More specifically, the first cleaning gases contain $NF_3$, $O_2$ and an inert gas such as Ar. These gases are introduced from a gas faceplate into the processing region of the CVD chamber and excited to plasma by a remote plasma source. The fluorine plasma generated from $NF_3$ reacts with the deposits in the chamber to generate a fluorine-containing gas, which is exhausted by a pump afterwards. Therefore, the surface of the wafer heater as well as the inner wall of the CVD chamber can all be cleaned. Note that, the fluorine plasma generated from $NF_3$ also reacts with the AlN material of the wafer heater to form an $Al_xF_yO_z$ film on the surface of the heater.

Wherein, the power of the remote plasma source can be 4000-7000 W; the flow rate of the $NF_3$ gas can be 200-700 sccm; the flow rate of the $O_2$ gas can be 6000-9000 sccm; and the flow rate of the inert gas can be 2000-8000 sccm. The faceplate can be disposed at different places of the chamber. The distance between the wafer heater and the faceplate can be 1-1000 mm, In the embodiment, the power of the remote plasma source is 5000 W, the distance between the wafer heater and the faceplate is 50 mm, the flow rate of the $NF_3$ gas is 300 sccm, the flow rate of the $O_2$ gas is 7000 sccm and the flow rate of the inert gas is 5000 sccm.

Step S02, second cleaning gases containing $N_2$ are introduced into the CVD chamber to remove the particles in the CVD chamber. More specifically, the second cleaning gases contain $N_2$ and an inert gas such as He. The second cleaning gases are introduced from the gas faceplate into the processing region of the CVD chamber and excited to $N_2$ plasma by a high frequency plasma source. The $N_2$ plasma makes the suspended particles attached to the surfaces of the interior chamber so as to remove the particles.

Wherein, the power of the high frequency plasma source can be 500-1600 W; the flow rate of the $N_2$ gas and the inert gas can be 1000-5000 sccm; and the process time of the second cleaning gas can be 0-100 seconds. In the embodiment, the power of the high frequency plasma source is 800 W, the flow rate of the $N_2$ gas and the He gas are both 3000 sccm and the process time is 50 s.

Step S03, third cleaning gases containing $O_2$ are fed into the CVD chamber to further remove the residual suspended particles in the CVD chamber. More specifically, the third cleaning gases contain $O_2$ and an inert gas such as He. The third cleaning gases are introduced from the gas faceplate and excited to $O_2$ plasma by a high frequency plasma source. The $O_2$ plasma flows away the residual suspended particles to further clean the CVD chamber.

Wherein, the power of the high frequency plasma source can be 800-1200 W; the flow rate of the $O_2$ gas and inert gas can be 3000-5000 sccm and the process time of the third cleaning gas can be 10-100 seconds. In the embodiment, the power of the high frequency plasma source is 1000 W, the flow rate of the $O_2$ and He gas are both 4000 sccm and the process time is 70 s.

Step S04, mixed gases containing $C_2H_2$ and at least one inert gas are fed into the CVD chamber for seasoning an amorphous carbon layer over the surfaces of the interior chamber and the heater. More specifically, the mixed gases contain hydrocarbon source gas $C_2H_2$ and at least one inert gas such as a mixture of He and Ar. The $C_2H_2$ in the mixed gases is decomposed by a high frequency power supply to form the amorphous carbon layer covering the $Al_xF_yO_z$ film formed in the step S01, as well as the particles attached to the surfaces of the interior chamber in the Step S02. It is noted that although the cleaning by-product of AlN may be formed through the reaction between the $N_2$ gas and the $Al_xF_yO_z$ film during the step S02, it will also be coated by the amorphous carbon layer, thus to prevent the backside of the wafer being contaminated by the AlN. On the other hand, since the at least one inert gas do not react with the $Al_xF_yO_z$ film or the by-product of AlN, new metal contaminants will not be generated on the surface of the amorphous carbon layer to attach to the backside of the wafer.

Wherein, the power of the high frequency plasma source can be 800-1200 W; the flow rate of the $C_2H_2$ gas and the inert gas can be 300-10000 sccm. In the embodiment, the power of the high frequency plasma source is 1000 W, the flow rate of the $C_2H_2$, He and Ar gas are both 2000 sccm.

Referring to FIG. 1, which illustrates the Al content attached to the backside of a wafer after the process of seasoning in the existing technology (a) and in accordance with the present invention (b), the Al content is 2400 $e^{10}$ atom/$cm^2$ in the existing technology while in an embodiment of the present invention, the Al content is less than 5 $e^{10}$ atom/$cm^2$. Therefore, the method of the present invention sharply reduces the metal contaminants at the backside of the wafer before the CVD process, thus to meet the requirement for the actual MOSFET device fabrication.

Figure 2:
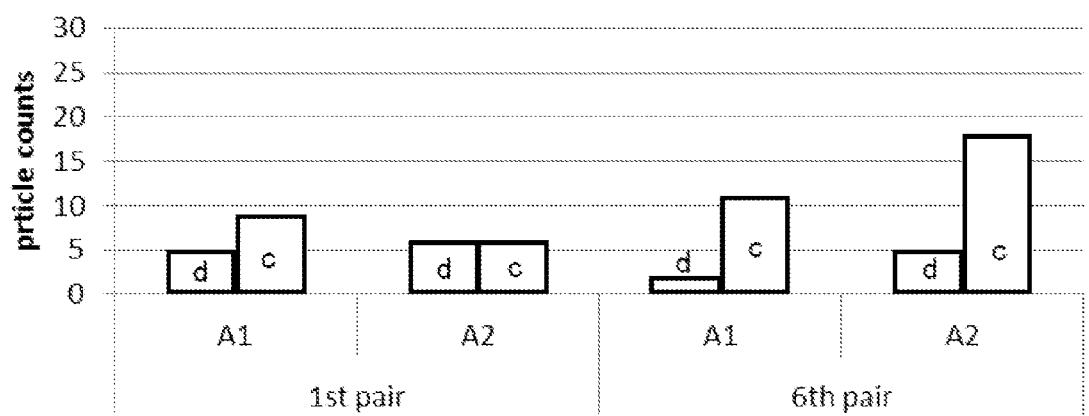
FIG. 2 is a contrast diagram showing of the amounts of the particles lager than 0.12 μm in the CVD chamber after seasoning between the existing technology and the method in accordance with present invention.

Referring to FIG. 2, which is a contrast diagram showing the amounts of the particles lager than 0.12 μm in the CVD chamber after seasoning between the existing technology (c) and the method in accordance with present invention (d), the particles in the CVD chamber after seasoning which may be attached to the wafer surface in the subsequent CVD process are effectively declined through the method of the present invention.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A method of reducing contamination in a CVD chamber, the CVD chamber comprises a wafer heater made of AlN material, the method comprising the steps of:

Step S01, cleaning the CVD chamber with first cleaning gases containing $NF_3$; wherein the $NF_3$ is excited into fluorine plasma through ionization, the fluorine plasma reacts with coatings on interior surfaces of the chamber and the heater to generate a fluorine-containing gas, which is exhausted by a pump afterwards, to clean the CVD chamber; the fluorine plasma also reacts with the AlN material of the heater to form an $Al_xF_yO_z$ film on a surface of the heater;

Step S02, introducing second cleaning gases containing $N_2$ into the CVD chamber, wherein some of the $N_2$ gas reacts with the $Al_xF_yO_z$ film to generate particles of AlN;

Step S03, further removing the particles of AlN in the CVD chamber with third cleaning gases containing $O_2$;

Step S04, seasoning an amorphous carbon layer on the interior surfaces of the chamber and the heater with mixed gases containing $C_2H_2$ and at least one inert gas; the amorphous carbon layer covers the $Al_xF_yO_z$ film as well as the particles of AlN attached to the interior surfaces of the chamber.

2. The method according to claim 1, wherein the first cleaning gases contain $NF_3$, $O_2$ and an inert gas in the step S01, and plasma of the first cleaning gases are excited by a remote plasma source to clean the CVD chamber.

3. The method according to claim 1, wherein the second cleaning gases contain $N_2$ and an inert gas in the step S02, and an $N_2$ plasma is generated by a plasma source.

4. The method according to claim 1, wherein the third cleaning gases contain $0_2$ and an inert gas in the step S03, and $0_2$ plasma is generated by a plasma source to further remove the particles in the CVD chamber.

5. The method according to claim 1, wherein the mixed gases are ionized by a plasma source to form the amorphous carbon film in the step S04.

6. The method according to claim 1, wherein at least one of the first cleaning gases, the second cleaning gases and the third cleaning gases comprises an inert gas, the inert gas of the cleaning gases and the inert gas of the mixed gases are selected from at least one of He, Ne, Ar, Kr, Xe, or Rn.

7. The method according to claim 1, wherein the at least one inert gas is a mixture of He and Ar.

8. The method according to claim 1, wherein the cleaning gases are introduced into the CVD chamber through a gas faceplate, a distance been the heater and the gas faceplate is 1-1000 mm.

9. The method according to claim 2, wherein a power of the remote plasma source is 4000-7000 W; a flow rate of the $NF_3$ gas is 200-700 sccm; a flow rate of the $0_2$ gas is 6000-9000 sccm; and a flow rate of the inert gas is 2000-8000 sccm.

10. The method according to claim 2, wherein the inert gas is Ar.

11. The method according to claim 3, wherein a power of the plasma source is 500-1600 W; a flow rate of the $N_2$ gas and inert gas are both 1000-5000 sccm; and a process time of the second cleaning gas is 0-100 seconds in the step S02.

12. The method according to claim 3, wherein the inert gas is He.

13. The method according to claim 4, wherein a power of the plasma source is 800-1200 W; a flow rate of the $0_2$ gas and inert gas are both 3000-5000 sccm; and a process time of the third cleaning gas is 10-100 seconds in the step S03.

14. The method according to claim 4, wherein the inert gas is He.

15. The method according to claim 5, wherein a power of the plasma source is 800-1200 W; and a flow rate of the $C_2H_2$ gas and the inert gas are both 300-10000 sccm in the step S04.

* * * * *